(12) United States Patent
Sakai et al.

(10) Patent No.: US 11,724,352 B2
(45) Date of Patent: Aug. 15, 2023

(54) WAFER PROCESSING METHOD

(71) Applicant: DISCO CORPORATION, Tokyo (JP)

(72) Inventors: Toshiyuki Sakai, Tokyo (JP); Heidi Lan, Tokyo (JP)

(73) Assignee: DISCO CORPORATION, Tokyo (JP)

(*) Notice: Subject to any disclaimer, the term of this patent is extended or adjusted under 35 U.S.C. 154(b) by 78 days.

(21) Appl. No.: 17/243,850

(22) Filed: Apr. 29, 2021

(65) Prior Publication Data

US 2021/0370460 A1 Dec. 2, 2021

(30) Foreign Application Priority Data

Jun. 2, 2020 (JP) ................................. 2020-096011

(51) Int. Cl.
| | |
|---|---|
| *B24B 7/22* | (2006.01) |
| *H01L 21/66* | (2006.01) |
| *H01L 21/683* | (2006.01) |
| *H01L 21/304* | (2006.01) |

(52) U.S. Cl.
CPC ............ *B24B 7/228* (2013.01); *H01L 21/304* (2013.01); *H01L 21/6836* (2013.01); *H01L 22/26* (2013.01); *H01L 2221/6834* (2013.01); *H01L 2221/68327* (2013.01)

(58) Field of Classification Search
CPC ... H01L 2221/68327; H01L 2221/6834; H01L 2221/68336; H01L 2221/683; H01L 21/6715; H01L 21/67092; H01L 21/67098; H01L 21/67103; H01L 21/67109; H01L 21/67115; H01L 21/67132; B24B 49/02; B24B 49/04; B24B 49/03; B24B 49/05
See application file for complete search history.

(56) References Cited

U.S. PATENT DOCUMENTS

| | | | |
|---|---|---|---|
| 2011/0294233 A1* | 12/2011 | Nakata | H01L 22/20 257/E21.53 |
| 2018/0337141 A1* | 11/2018 | Priewasser | H01L 21/6836 |
| 2020/0135531 A1* | 4/2020 | Sekiya | H01L 21/6838 |
| 2021/0028026 A1* | 1/2021 | Migiyama | H01L 21/6776 |

FOREIGN PATENT DOCUMENTS

JP 2019169727 A 10/2019

* cited by examiner

*Primary Examiner* — Julio J Maldonado
*Assistant Examiner* — Stanetta D Isaac
(74) *Attorney, Agent, or Firm* — Greer, Burns & Crain, Ltd.

(57) ABSTRACT

A wafer processing method in which a wafer including devices on a front surface side is processed. The method includes a wafer-with-protective-component forming step of forming the wafer with a protective component through sticking the protective component formed of a resin that softens by heat to the front surface side by pressing and heating the protective component, a thickness measurement step of measuring a thickness of the protective component in the wafer with the protective component, and a grinding step of holding the wafer with the protective component by a chuck table and grinding a back surface side of the wafer until a thickness of the wafer becomes an intended finished thickness. In the grinding step, the thickness of the protective component measured in the thickness measurement step is subtracted from a total thickness of the wafer with the protective component to calculate the thickness of the wafer.

2 Claims, 11 Drawing Sheets

WAFER PROCESSING METHOD

BACKGROUND OF THE INVENTION

Field of the Invention

The present invention relates to a wafer processing method in which a back surface side of a wafer including devices on a front surface side is ground after a protective component is stuck to the front surface side of the wafer, a protective component sticking apparatus that sticks a protective component to a front surface side of a wafer, and a processing apparatus including a protective component sticking apparatus and a grinding apparatus.

Description of the Related Art

Device chips mounted on electronic equipment and so forth are manufactured through grinding of a back surface side of a wafer made of silicon and cutting of the wafer after devices are formed in respective regions on a front surface side marked out by plural planned dividing lines set in the front surface of the wafer, for example. When the wafer is ground, a protective tape made of a resin is stuck to the front surface side of the wafer. Thereby, the risk of breakage of the wafer is reduced. Furthermore, adhesion of grinding dust and so forth to the front surface side of the wafer is prevented. The protective tape is composed of a base layer made of a resin and an adhesive layer (glue layer) made of a resin, for example.

When the protective tape is stuck to the front surface side of the wafer, first, the protective tape is disposed over the wafer in such a manner that the glue layer side faces the front surface side. Subsequently, in order for the protective tape to get close contact with the wafer in line with irregularities on the front surface side of the wafer, the protective tape is pressed while being softened by application of heat to the base layer side. In this case, the thickness of the protective tape often becomes slightly small compared with the thickness before the heating and pressing. However, in the case of using the protective tape having the glue layer, when the protective tape is separated, an adhesive that configures the glue layer remains on an electrode bump or the like and the residual of the adhesive becomes a cause of a defect of the electrode bump in some cases. Thus, a technique has been devised in which a sheet-shaped protective component that does not have a glue layer and is made of a resin is brought into close contact with a front surface side of a wafer while being softened by application of heat (for example, refer to Japanese Patent Laid-open No. 2019-169727).

SUMMARY OF THE INVENTION

However, also in the case of the protective component that does not have a glue layer, the thickness of the protective component often becomes slightly smaller according to sticking conditions such as a heating temperature, a pressing time, and so forth at the time of heating and pressing, similarly to a protective tape having a glue layer. If the thickness of the protective component changes, for example, grinding conditions such as an amount of grinding feed change when the wafer is ground to a predetermined finished thickness. The present invention is made in view of this problem and intends to reduce an influence of change in the thickness of a protective component on processing conditions of grinding and so forth even when the thickness of the protective component changes between before and after heating and pressing.

In accordance with an aspect of the present invention, there is provided a wafer processing method in which a wafer including devices on a front surface side is processed. The wafer processing method includes a wafer-with-protective-component forming step of forming the wafer with a protective component through sticking the protective component formed of a resin that softens by heat to the front surface side of the wafer by pressing the protective component while heating the protective component, a thickness measurement step of measuring a thickness of the protective component in the wafer with the protective component, and a grinding step of holding the wafer with the protective component by a holding surface of a chuck table and grinding a back surface side of the wafer until a thickness of the wafer becomes an intended finished thickness. In the grinding step, the thickness of the protective component measured in the thickness measurement step is subtracted from a total thickness of the wafer with the protective component to calculate the thickness of the wafer, and the back surface side of the wafer is ground.

Preferably, the protective component used in the wafer-with-protective-component forming step is a sheet of a single-wafer system formed by pressing a thermoplastic resin that softens by heat while heating the thermoplastic resin.

In accordance with another aspect of the present invention, there is provided a protective component sticking apparatus that sticks a protective component to a front surface side of a wafer including devices on the front surface side. The protective component sticking apparatus includes a protective component sticking unit that has a support table and a pressing body and forms the wafer with the protective component through sticking the protective component formed of a resin that softens by heat to the front surface side of the wafer by pressing the protective component against the front surface side of the wafer while heating the protective component with use of the pressing body and the support table, a thickness measuring unit that has a thickness measuring instrument and measures a thickness of the protective component in the wafer with the protective component, and a transmitting part for transmitting information on the thickness of the protective component measured by the thickness measuring unit to an external of the protective component sticking apparatus.

In accordance with a further aspect of the present invention, there is provided a processing apparatus including a protective component sticking apparatus that sticks a protective component to a front surface side of a wafer including devices on the front surface side and a grinding apparatus that grinds the wafer for which the protective component has been stuck to the front surface side. The protective component sticking apparatus includes a protective component sticking unit that has a support table and a pressing body and forms the wafer with the protective component through sticking the protective component formed of a resin that softens by heat to the front surface side of the wafer by pressing the protective component against the front surface side of the wafer while heating the protective component with use of the pressing body and the support table, a thickness measuring unit that has a thickness measuring instrument and measures a thickness of the protective component in the wafer with the protective component, and a transmitting part for transmitting information on the thickness of the protective component measured by the thickness measuring unit to the grinding apparatus. The grinding apparatus includes a chuck table that holds the wafer with the protective component, a grinding unit that has a circular columnar spindle and a circular annular grinding wheel mounted on a lower end part of the spindle and grinds a back surface side of the wafer with the front surface side held by the chuck table, and a grinding feed unit that executes grinding feed of the grinding unit toward the chuck table. The processing apparatus further includes a control part that has a processor and controls operation of the grinding feed unit. The control part has a recording part in which the information on the thickness of the protective component measured by the thickness measuring unit, information on a total thickness of the wafer with the protective component, and information on an intended finished thickness of the wafer after grinding are recorded. The control part calculates a thickness of the wafer by subtracting the thickness of the protective component from the total thickness of the wafer with the protective component, and the control part controls the operation of the grinding feed unit to grind the back surface side of the wafer and grind the wafer until the thickness of the wafer reaches the intended finished thickness.

The wafer processing method according to one aspect of the present invention includes the wafer-with-protective-component forming step, the thickness measurement step of measuring the thickness of the protective component in the wafer with the protective component, and the grinding step of grinding the back surface side of the wafer. Further, in the grinding step, the thickness of the protective component measured in the thickness measurement step is subtracted from the total thickness of the wafer with the protective component to calculate the thickness of the wafer. Therefore, even when the thickness of the protective component changes between before and after the heating and the pressing, the influence of the change in the thickness of the protective component on processing conditions can be reduced. That is, even when the thickness of the protective component changes, the wafer can be processed after processing conditions are correctly set to achieve the intended finished thickness.

Furthermore, the protective component sticking apparatus according to another aspect of the present invention includes the protective component sticking unit that forms the wafer with the protective component through sticking the protective component formed of the resin that softens by heat to the front surface side of the wafer by pressing the protective component while heating the protective component. The protective component sticking apparatus also includes the thickness measuring unit that measures the thickness of the protective component in the wafer with the protective component and the transmitting part for transmitting the thickness of the protective component measured by the thickness measuring unit to the external of the protective component sticking apparatus. Therefore, even when the thickness of the protective component changes between before and after the heating and the pressing, information on the thickness of the protective component after the change can be transmitted from the transmitting part to the external of the protective component sticking apparatus. When the wafer is processed with use of the information on the thickness of the protective component, the influence of the change in the thickness of the protective component on processing conditions can be reduced.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
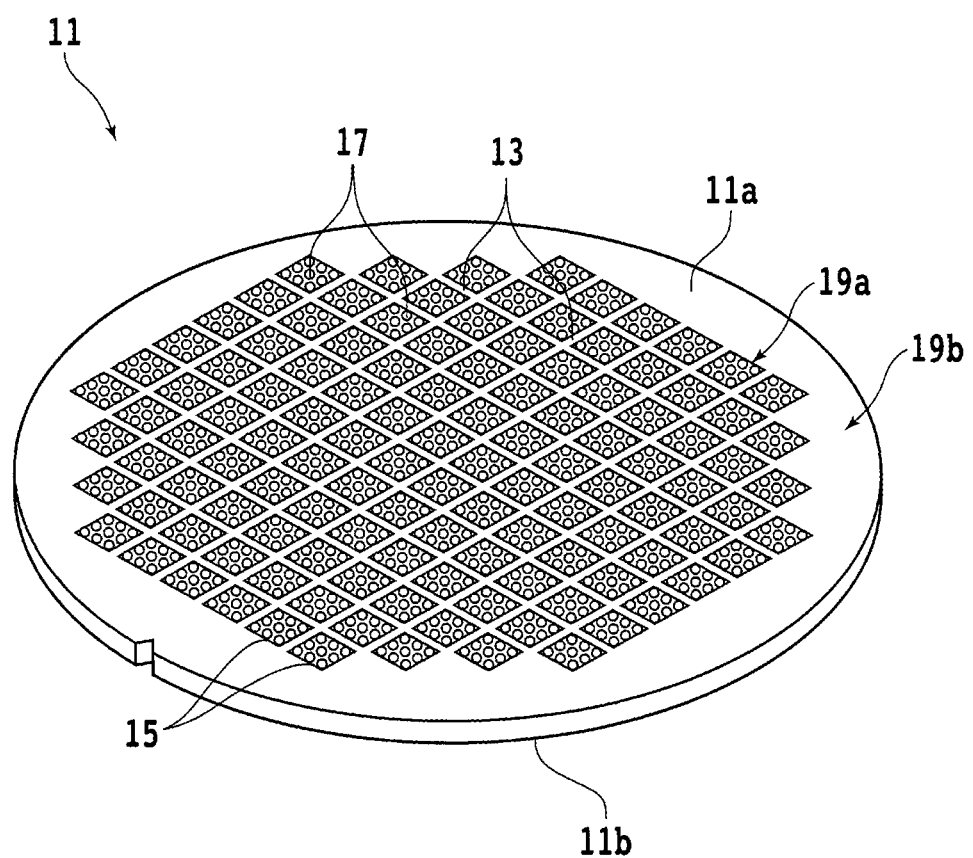
FIG. 1 is a perspective view of a wafer.

Embodiments according to one aspect of the present invention will be described with reference to the accompanying drawings. First, a wafer 11 that is a processing target in a first embodiment and has a circular disc shape will be described. FIG. 1 is a perspective view of the wafer 11. The wafer 11 is formed of a semiconductor material such as silicon (Si), silicon carbide (SiC), gallium nitride (GaN), or gallium arsenide (GaAs). Plural planned dividing lines 13 are set in a lattice manner in a front surface 11a of the wafer 11.

A device 15 such as an integrated circuit (IC) or a large scale integration (LSI) is formed in each of regions on the side of the front surface 11a marked out by the plural planned dividing lines 13. Plural bumps 17 are disposed on each device 15. Each of the plural bumps 17 is formed of a metal material such as gold, silver, or copper. Each bump 17 is electrically connected to the device 15 and protrudes by, for example, approximately 100 μm relative to an upper surface of the device 15.

A central region of the wafer 11 in which the plural devices 15 are disposed is a device region 19a. A peripheral side of the device region 19a is surrounded by a peripheral surplus region 19b that does not have devices 15, bumps 17, and so forth and is flat compared with the device region 19a. When device chips are to be manufactured from the wafer 11, prior to grinding of the side of a back surface 11b of the wafer 11, a protective component 23 (see FIG. 3B) is stuck to the side of the front surface 11a of the wafer 11 by using a protective component sticking apparatus 10 (see FIG. 2).

Figure 2:
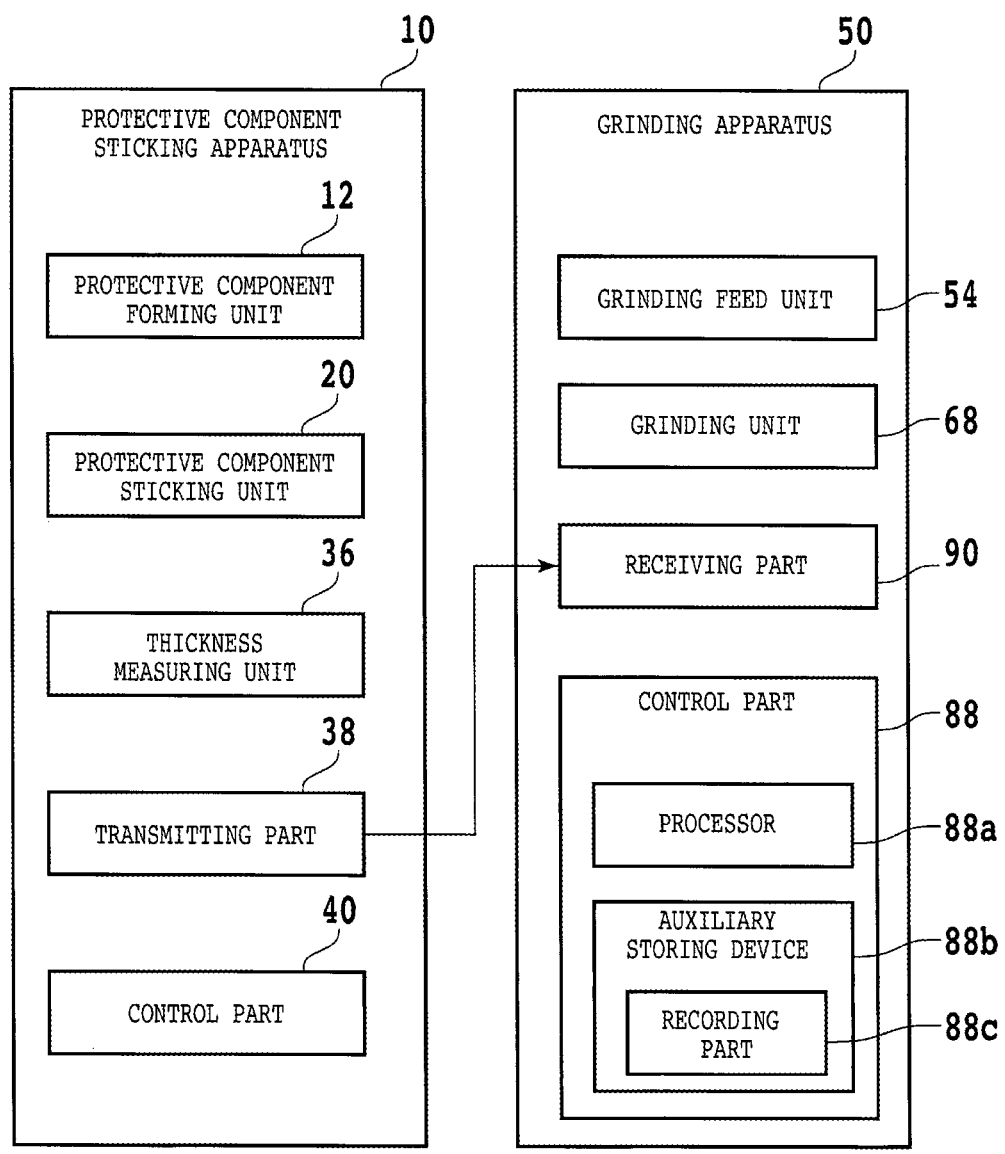
FIG. 2 is a block diagram illustrating an outline of a protective component sticking apparatus and so forth.
Figure 3A:
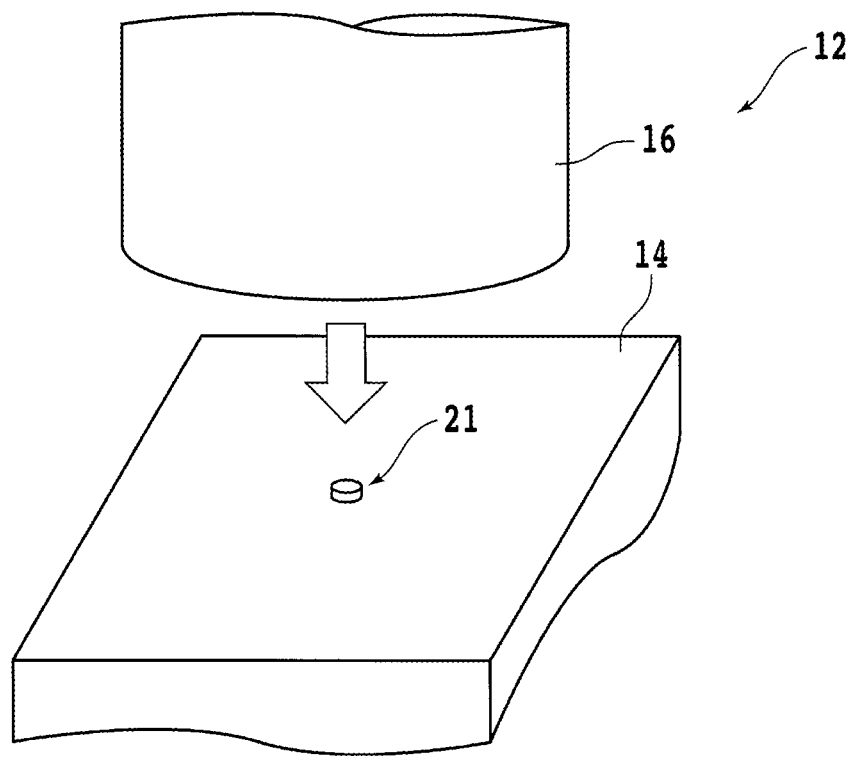
FIG. 3A is a perspective view of a protective component forming unit and so forth.

FIG. 2 is a block diagram illustrating an outline of the protective component sticking apparatus 10 and so forth according to the first embodiment. First, a configuration of the protective component sticking apparatus 10 will be described by using FIG. 3A, FIG. 3B, FIG. 4, and FIG. 6 to FIG. 8. The protective component sticking apparatus 10 includes a protective component forming unit 12 for forming the sheet-shaped protective component 23 that does not have a glue layer and is made of a resin. FIG. 3A is a perspective view of the protective component forming unit 12 and so forth.

The protective component forming unit 12 is formed of a metal such as stainless steel and has a table 14 having a substantially flat upper surface. A pressing body 16 that is formed of a metal such as stainless steel and has a substantially circular column shape is disposed above the table 14. A bottom surface of the pressing body 16 is substantially flat. Furthermore, a heat generator (not illustrated) of an electric resistance heating system is disposed inside the pressing body 16. A vertical movement mechanism (not illustrated) of a ball screw system that moves the pressing body 16 in an upward-downward direction is coupled to an upper part of the pressing body 16.

In the case of forming the protective component 23 by using the protective component forming unit 12, first, a pellet 21 formed of a thermoplastic resin that softens by heat is disposed on an upper surface of the table 14. The thermoplastic resin is a polyolefin-based resin such as polyethylene, polypropylene, or polystyrene or a polyester-based resin such as polyethylene terephthalate, for example.

Figure 3B:
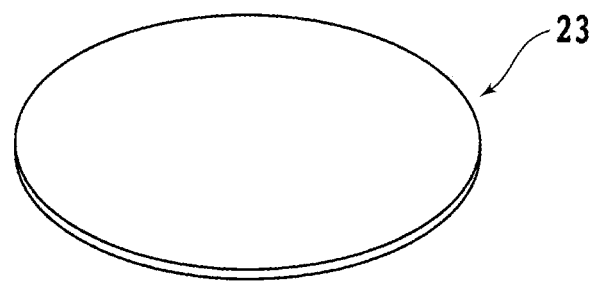
FIG. 3B is a perspective view of one protective component.

In the present embodiment, after a temperature of the pressing body 16 is adjusted to a predetermined temperature according to the material of the thermoplastic resin, the pellet 21 is pressed against the table 14 by the pressing body 16 while the pellet 21 is heated. At this time, the pellet 21 is heated to a predetermined temperature (for example, a predetermined temperature of at least 160° C. and at most 180° C. when the pellet 21 is formed of polypropylene) that exceeds a softening point. Thereby, the pellet 21 is softened or melted to be shaped into a substantially circular shape, and one protective component 23 is formed by one time of heating and pressing process. As above, the protective component 23 of the present embodiment is a resin sheet formed by processing of a single-wafer system. FIG. 3B is a perspective view of the one protective component 23. The protective component 23 has a predetermined diameter larger than a diameter of the wafer 11. Furthermore, the protective component 23 has a predetermined thickness of, for example, at least 80 μm and at most 100 μm although slight variation is caused according to conditions at the time of the formation.

In the present embodiment, the protective component 23 is formed from the pellet 21 by using the protective component forming unit 12 disposed in the protective component sticking apparatus 10. Therefore, the protective component 23 does not need to be taken out from a roll body obtained by winding an elongated protective component into a roll shape. In general, a comparatively-large clean room for industrial use is required for creation of the roll body. However, in the present embodiment, because the roll body is not used, it suffices that air cleanliness of a comparatively-small space used at the time of pressing of the pellet 21 is controlled. For this reason, manufacturing cost per one protective component 23 can be reduced compared with the case of using the roll body.

Figure 4:
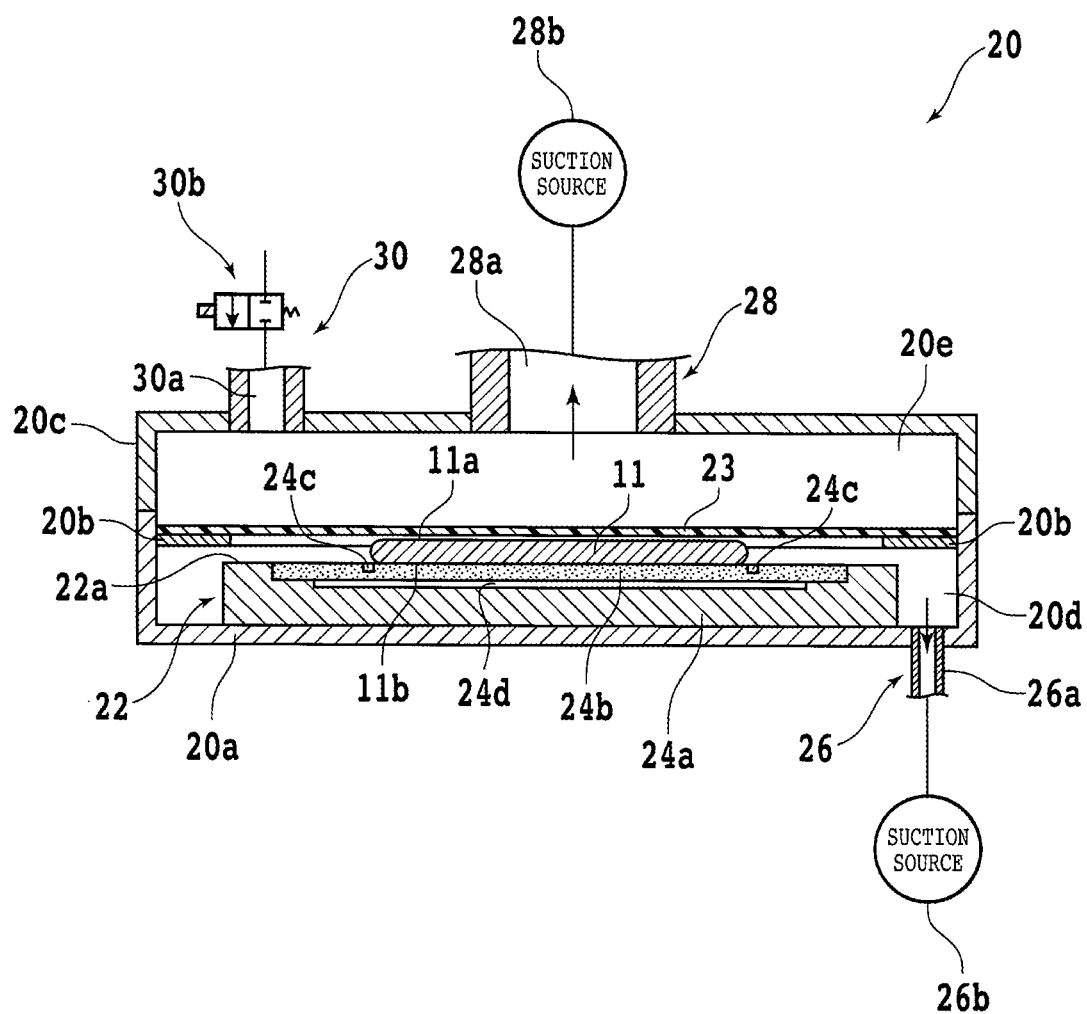
FIG. 4 is a partial sectional side view of a protective component sticking unit and so forth.

Next, the protective component 23 is stuck to the side of the front surface 11a of the wafer 11 by using a protective component sticking unit 20 disposed in the protective component sticking apparatus 10. FIG. 4 is a partial sectional side view of the protective component sticking unit 20 and so forth. The protective component sticking unit 20 has a lower main body 20a that is formed of a metal such as stainless steel and has a recessed shape having an opening part on an upper side. An annular plate 20b that can support the protective component 23 is disposed inside the opening part of the lower main body 20a. A chuck table (support table) 22 with a circular disc shape is disposed under the annular plate 20b. The chuck table 22 has a frame body 24a made of a metal.

A porous plate 24b that is formed of a porous component and has a circular disc shape is fixed to an upper part of the frame body 24a. In the porous plate 24b, an annular groove 24c centered at a center of an upper surface of the porous plate 24b is formed. The annular groove 24c has a predetermined diameter larger than the diameter of the wafer 11 and functions as a clearance groove for a cutting blade 34c (see FIG. 7) used when the protective component 23 is cut. The porous plate 24b connects to a suction source (not illustrated) such as an ejector through a flow path 24d formed in the frame body 24a, and so forth. The upper surfaces of the frame body 24a and the porous plate 24b are flush and configure a substantially flat holding surface 22a.

A gas discharge part 26 is disposed at a bottom part of the lower main body 20a. The gas discharge part 26 has a circular cylindrical gas discharge pipe (gas discharge path) 26a with one end connected to a space in the lower main body 20a. A suction source 26b such as an ejector is connected to another end of the gas discharge pipe 26a. An upper main body 20c with a recessed shape having an opening part on a lower side is disposed over the lower main body 20a. The upper main body 20c has the opening part with substantially the same shape as the opening part of the lower main body 20a. The upper main body 20c can rise and lower relative to the lower main body 20a. When the upper main body 20c is disposed on the lower main body 20a in such a manner that the respective opening parts overlap, a space cut off from an external is formed.

A gas discharge part 28 is disposed at a top part of the upper main body 20c. The gas discharge part 28 has a circular cylindrical gas discharge pipe (gas discharge path) 28a with one end connected to a space in the upper main body 20c. A suction source 28b such as an ejector is connected to another end of the gas discharge pipe 28a. A gas feed part 30 is disposed at a position different from the gas discharge part 28 in the top part of the upper main body 20c. The gas feed part 30 has a circular cylindrical gas feed pipe (gas feed path) 30a with one end connected to the space in the upper main body 20c. Furthermore, a solenoid valve 30b is disposed for the gas feed pipe 30a.

Although being omitted in FIG. 4, a pressing body 32 (see FIG. 6) with a circular disc shape is disposed in the recessed part of the upper main body 20c. The pressing body 32 is formed of a metal such as stainless steel and has a substantially flat lower surface 32a. A heat generator 32b of an electric resistance heating system is disposed inside the pressing body 32. A vertical movement mechanism (not illustrated) of a ball screw system that moves the pressing body 32 in the upward-downward direction is coupled to an upper part of the pressing body 32.

A cutting mechanism 34 (see FIG. 7) is disposed outside the lower main body 20a. The cutting mechanism 34 can move to a position above the lower main body 20a by a movement mechanism that is not illustrated in the diagram. The cutting mechanism 34 has a bar-shaped arm part 34a disposed substantially in parallel to the holding surface 22a. Between one end and another end of the arm part 34a, an output shaft 34b of a rotational drive source (not illustrated) such as a motor is disposed substantially in parallel to a direction orthogonal to the holding surface 22a. A lower part of the output shaft 34b is coupled to the arm part 34a. Furthermore, the cutting blade 34c is coupled to one end part of the arm part 34a.

A thickness measuring unit 36 (see FIG. 8) having a thickness measuring instrument 36a for measuring the thickness of the protective component 23 is disposed near the protective component sticking unit 20. The thickness measuring instrument 36a is a laser displacement meter of the spectral interference system, for example. Information on the thickness of the protective component 23 measured by the thickness measuring instrument 36a is transmitted to an external of the protective component sticking apparatus 10 by a transmitting part 38 (see FIG. 2). The transmitting part 38 transmits the information on the thickness of the protective component 23 through a wireless local area network (LAN), a wired LAN, or the like.

For example, when a wireless LAN is used, the transmitting part 38 is a transmitter having a signal source, a modulation circuit, an amplifier, an antenna, and so forth and transmits the information on the thickness of the protective component 23 to a receiving part 90 of a grinding apparatus 50 to be described later. Operation of the transmitting part 38 and so forth is controlled by a control part 40. The control part 40 controls operation of the protective component forming unit 12, the protective component sticking unit 20, the thickness measuring unit 36, and so forth in addition to the transmitting part 38.

Figure 9:
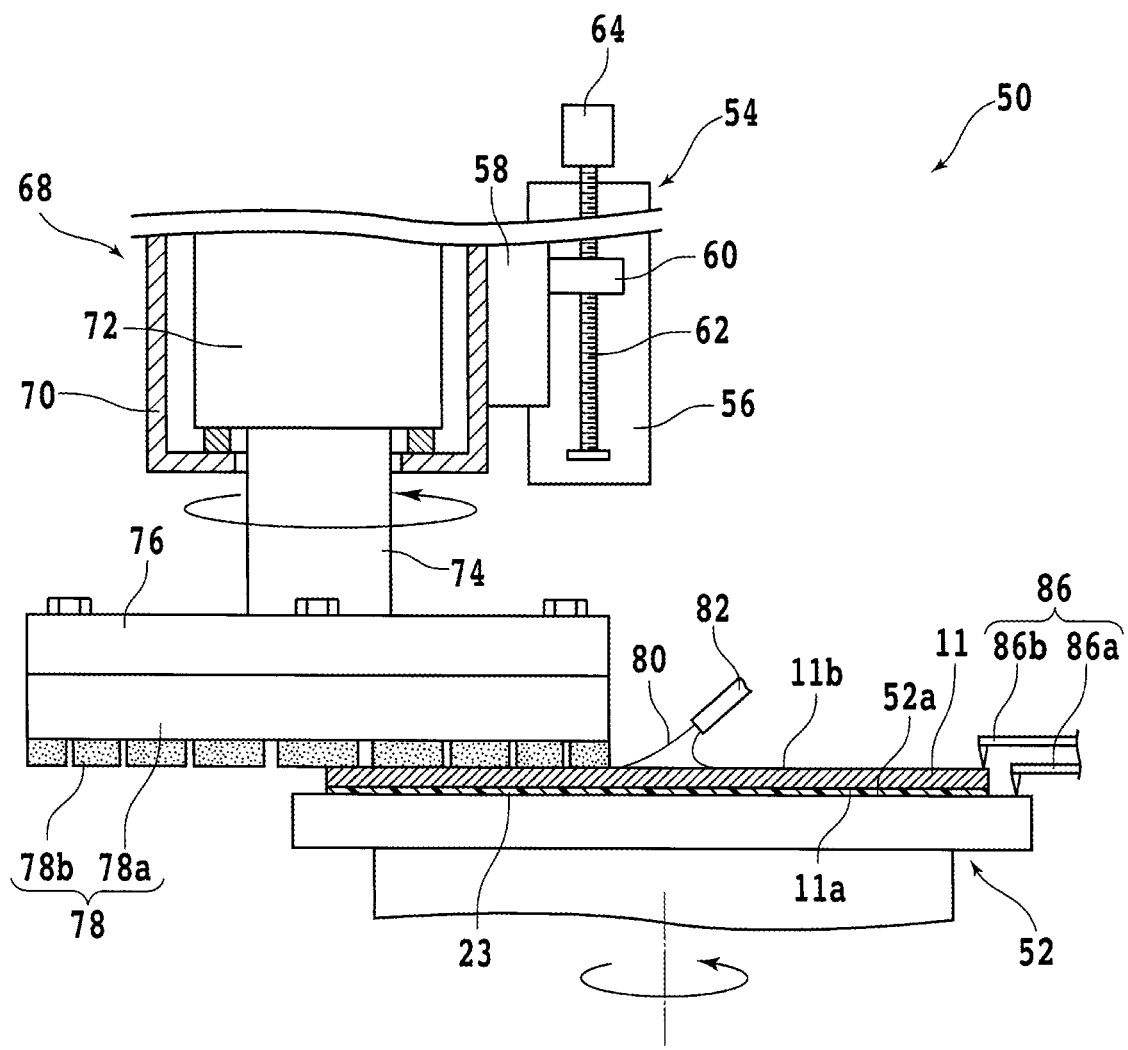
FIG. 9 is a diagram illustrating a grinding step.

For example, the control part 40 is configured by a computer including a processor (processing device) typified by a central processing unit (CPU), a main storing device such as a dynamic random access memory (DRAM), a static random access memory (SRAM), and a read only memory (ROM), and an auxiliary storing device such as a flash memory, a hard disk drive, and a solid state drive. Software including a predetermined program is stored in the auxiliary storing device. Functions of the control part 40 are implemented by causing the processor and so forth to operate according to the software. Next, the grinding apparatus 50 will be described with reference to FIG. 9.

The grinding apparatus 50 has a chuck table 52 with a circular disc shape. The chuck table 52 includes a frame body that is formed of ceramic and has a circular disc shape. A recessed part with a circular disc shape is formed at an upper part of the frame body, and a porous plate that is formed of a porous component and has a substantially circular disc shape is fixed to the recessed part. The porous plate is connected to a suction source (not illustrated) such as an ejector through a flow path (not illustrated) formed in the frame body, and so forth. When the suction source is operated, a negative pressure is generated at an upper surface of the porous plate. An upper surface of the frame body and the upper surface of the porous plate are substantially flush and function as a holding surface 52a that holds the wafer 11 or the like under suction.

A rotational drive source (not illustrated) having a motor or the like is disposed under the chuck table 52. An output shaft of the rotational drive source is coupled to a lower part of the chuck table 52. When the rotational drive source is operated, the chuck table 52 rotates around the output shaft. A grinding feed unit 54 is disposed above the chuck table 52. The grinding feed unit 54 is disposed on a prism-shaped column (not illustrated) disposed substantially vertically with respect to a base (not illustrated).

The grinding feed unit 54 has a pair of guide rails 56 that are fixed to one side surface of the column and are substantially parallel to the vertical direction. A moving plate 58 is slidably attached to the pair of guide rails 56. A nut part 60 is disposed on a back surface side (column side) of the moving plate 58. A ball screw 62 disposed substantially in parallel to the pair of guide rails 56 is rotatably coupled to the nut part 60.

A pulse motor 64 is coupled to an upper end part of the ball screw 62. When the ball screw 62 is rotated by the pulse motor 64, the moving plate 58 moves in the vertical direction (upward-downward direction) along the guide rails 56. A grinding unit 68 is fixed to a front surface side of the moving plate 58. The grinding unit 68 has a circular cylindrical holding component 70 fixed to the moving plate 58. A circular cylindrical spindle housing 72 disposed substantially in parallel to the vertical direction is set inside the holding component 70.

In the spindle housing 72, part of a circular columnar spindle 74 disposed substantially in parallel to the vertical direction is housed in a rotatable state. A motor (not illustrated) is disposed at an upper end part of the spindle 74. A lower end part of the spindle 74 protrudes downward relative to a lower surface of the holding component 70, and an upper surface of a wheel mount 76 with a circular disc shape is fixed to the lower end part of the spindle 74. A circular annular grinding wheel 78 is mounted on a lower surface of the wheel mount 76.

The grinding wheel 78 has a circular annular wheel base 78a formed of a metal material such as stainless steel and plural grinding abrasive stones 78b mounted on a lower surface side of the wheel base 78a. The plural grinding abrasive stones 78b are annularly arranged along a circumference of the lower surface of the wheel base 78a in such a manner that gaps are made between adjacent ones of the grinding abrasive stones 78b. Each grinding abrasive stone 78b is formed through mixing abrasive grains of diamond, cubic boron nitride (cBN), or the like with a binder of a metal, ceramic, resin, or the like, for example. The materials of the binder and the abrasive grains are not particularly limited and can be selected as appropriate according to specifications of the grinding abrasive stones 78b.

A nozzle 82 for supplying grinding water 80 such as purified water to a contact region between the grinding abrasive stones 78b and the wafer 11 is disposed above the holding surface 52a. Further, in a region separate from the grinding unit 68 in a peripheral part of the holding surface 52a, a thickness measuring instrument 86 for measuring the thickness of the wafer 11 and so forth in grinding is disposed. The thickness measuring instrument 86 has a first height gauge 86a that has a tip part that gets contact with the holding surface 52a and is for measuring a height of the holding surface 52a. Furthermore, the thickness measuring instrument 86 has a second height gauge 86b that has a tip part that gets contact with the back surface 11b of the wafer 11 held by the holding surface 52a and is for measuring a height of the back surface 11b.

A sum of the thicknesses (that is, a total thickness) of the wafer 11 and the protective component 23 in grinding is measured by calculating a difference between the height of the holding surface 52a and the height of the back surface 11b. Operation of the chuck table 52, the grinding feed unit 54, the grinding unit 68, and so forth is controlled by a control part 88. For example, the control part 88 is configured by a computer including a processor (processing device) 88a typified by a CPU, a main storing device (not illustrated) such as a DRAM, an SRAM, and a ROM, and an auxiliary storing device 88b such as a flash memory, a hard disk drive, and a solid state drive.

Software including a predetermined program is stored in the auxiliary storing device 88b. Functions of the control part 88 are implemented by causing the processor 88a and so forth to operate according to the software. The auxiliary storing device 88b includes a recording part 88c having a predetermined recording area. In the recording part 88c, the respective pieces of information on the thickness of the protective component 23 measured by the thickness measuring unit 36, the total thickness of the wafer 11 with the protective component 23, and an intended finished thickness of the wafer 11 after grinding are recorded. The information on the thickness of the protective component 23 measured by the thickness measuring unit 36 is transmitted from the transmitting part 38 of the protective component sticking apparatus 10 and is received by the receiving part 90 of the grinding apparatus 50. For example, when a wireless LAN is used, the receiving part 90 is a receiver having an antenna, an amplifier, a demodulation circuit, and so forth.

Figure 10:
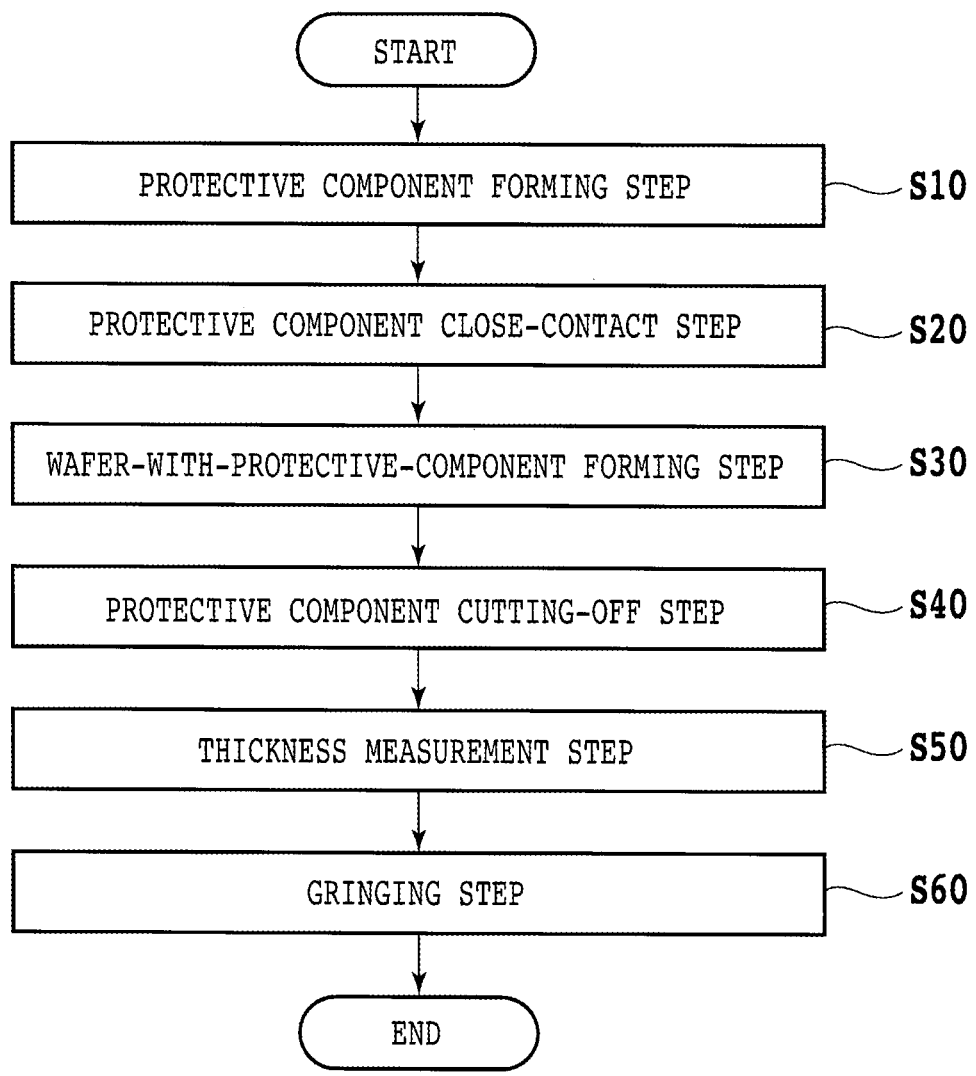
FIG. 10 is a flowchart of a processing method of a wafer.

Next, a wafer processing method in which the wafer 11 is processed by using the protective component sticking apparatus 10 and the grinding apparatus 50 will be described with reference to FIG. 3A to FIG. 10. FIG. 10 is a flowchart of the processing method of the wafer 11. First, by heating and pressing the pellet 21 formed of a thermoplastic resin by using the protective component forming unit 12 illustrated in FIG. 3A, the pellet 21 is softened or melted to be shaped into a substantially circular shape, and one sheet-shaped protective component 23 (see FIG. 3B) is formed (protective component forming step S10).

After the protective component forming step S10, the protective component 23 is brought into close contact with the side of the front surface 11a of the wafer 11 by using the protective component sticking unit 20 (protective component close-contact step S20). In the protective component close-contact step S20, first, the side of the back surface 11b of the wafer 11 is supported by the chuck table 22, and the side of the back surface 11b is held under suction by the holding surface 22a. Then, the protective component 23 is conveyed by using a sheet conveying apparatus (not illustrated) having plural suction pads and is placed on the annular plate 20b. At this time, as illustrated in FIG. 4, the protective component 23 is supported by the annular plate 20b in such a manner as not to get contact with the front surface 11a.

For example, by pressing a peripheral part of the protective component 23 against the annular plate 20b by a pressing component (not illustrated), the protective component 23 is supported in such a manner as not to get contact with the front surface 11a. Instead of using the pressing component, an opening of the annular plate 20b may be set smaller in such a manner that a diameter defined by an inner circumferential end of the annular plate 20b becomes slightly larger than the diameter of the wafer 11. Subsequently, the upper main body 20c is disposed on the lower main body 20a to form a space cut off from the external, and thereafter the suction sources 26b and 28b are each operated. Thereby, a first space 20d configured by the protective component 23 and the lower main body 20a and a second space 20e configured by the protective component 23 and the upper main body 20c are each subjected to pressure reduction to approximately 1000 Pa.

Figure 5:
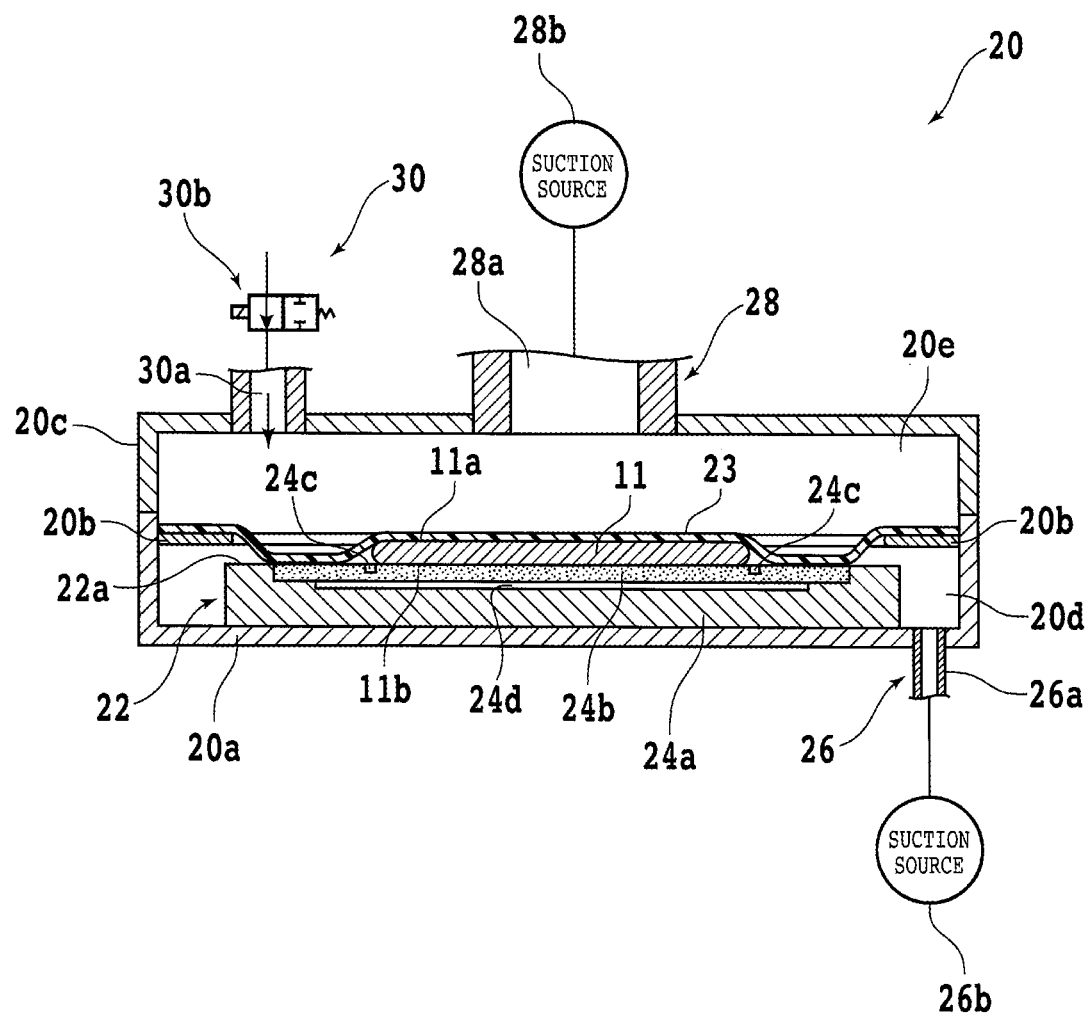
FIG. 5 is a diagram illustrating a manner in which the protective component is brought into close contact with a front surface side of the wafer by using air pressure difference.

After the pressure reduction, the operation of the suction sources 26b and 28b is stopped, and the upper main body 20c is vented to an atmosphere by setting the solenoid valve 30b to an opened state with the pressure of the first space 20d kept at approximately 1000 Pa. Thereby, an air pressure in the recessed part of the upper main body 20c suddenly rises to become an atmospheric pressure, and the protective component 23 is pressed toward the side of the front surface 11a due to an air pressure difference. The protective component 23 gets deformed in such a manner as to follow the irregular shape on the side of the front surface 11a and gets close contact with the side of the front surface 11a (protective component close-contact step S20). FIG. 5 is a diagram illustrating a manner in which the protective component 23 is brought into close contact with the side of the front surface 11a by using the air pressure difference.

Figure 6:
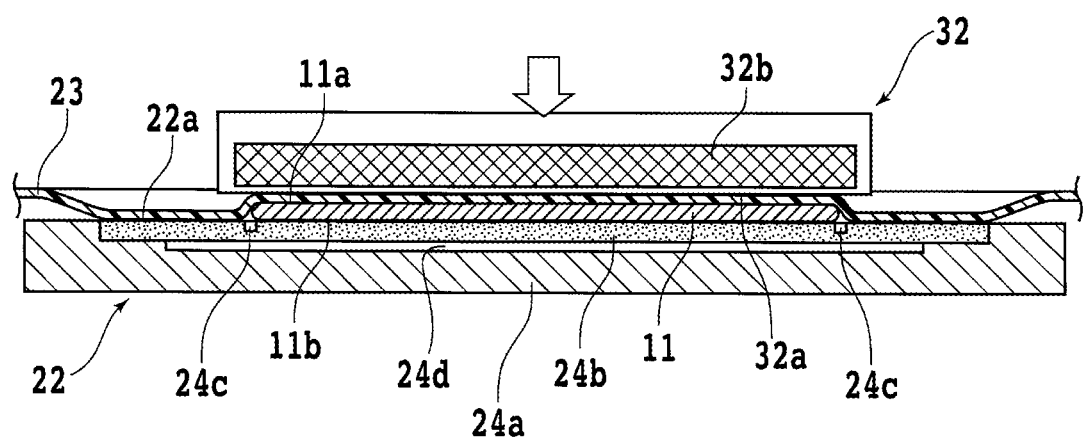
FIG. 6 is a diagram illustrating a wafer-with-protective-component forming step.

After the protective component close-contact step S20, the pressing body 32 is moved downward in a state in which the heat generator 32b is heated, and the protective component 23 is pressed against the side of the front surface 11a by the lower surface 32a (see FIG. 6). For example, the pressing body 32 is set to a predetermined temperature of at least 50° C. and at most 120° C., and the pressing is executed for approximately 30 seconds at a predetermined pressing pressure of at least 0.2 MPa and at most 0.8 MPa. Thereby, the protective component 23 is stuck to the side of the front surface 11a, and the wafer 11 with the protective component 23 is formed (wafer-with-protective-component forming step S30).

Figure 7:
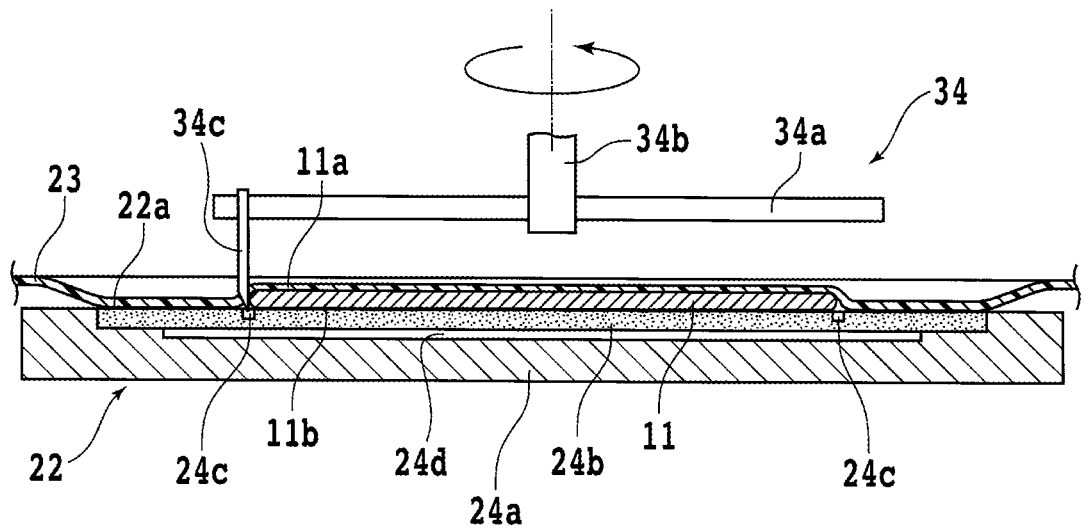
FIG. 7 is a diagram illustrating a protective component cutting-off step.
Figure 8:
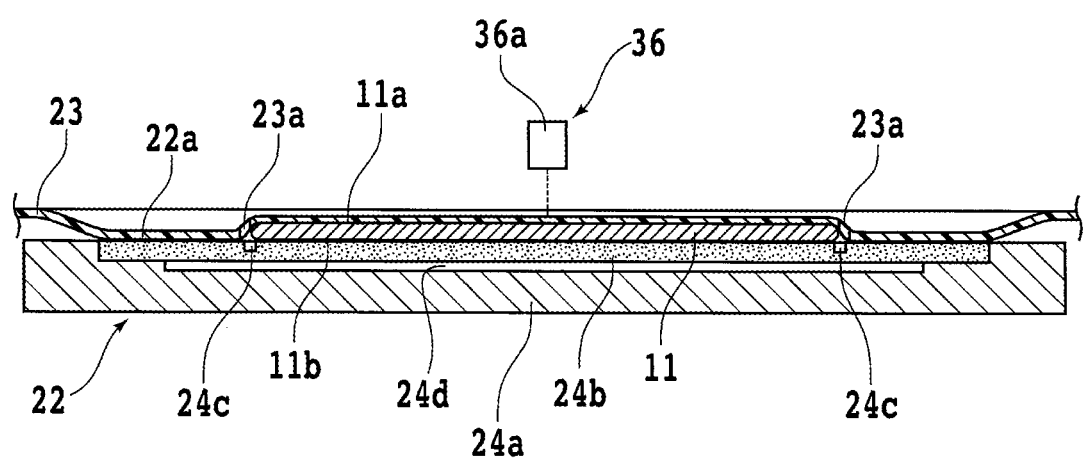
FIG. 8 is a diagram illustrating a thickness measurement step.

In the wafer-with-protective-component forming step S30, the protective component 23 is softened by heating. Therefore, the protective component 23 can be brought into closer contact with the side of the front surface 11a than in the case without heating. After the pressing body 32 evacuates, the wafer 11 with the protective component 23 is cooled. The thickness of the protective component 23 decreases by at least 5% and at most 20% (for example, approximately 10%) compared with before the wafer-with-protective-component forming step S30 in some cases. After the wafer-with-protective-component forming step S30, as illustrated in FIG. 7, the protective component 23 is cut off into substantially the same diameter as the wafer 11 by using the cutting mechanism 34 (protective component cutting-off step S40).

In the protective component cutting-off step S40, the protective component 23 is cut into a circular shape by forming a cut 23a (see FIG. 8) with a predetermined diameter in the protective component 23. After the protective component cutting-off step S40, the thickness of the protective component 23 in the wafer 11 with the protective component 23 is measured by using the thickness measuring unit 36 (thickness measurement step S50). In the thickness measurement step S50, the thickness of one or more places in the protective component 23 is measured. In the present embodiment, after the thicknesses of plural places in the protective component 23 are measured by the thickness measuring unit 36, the control part 40 calculates an arithmetic mean of these thicknesses of the plural places and employs an average thickness as a representative thickness of the protective component 23. A calculation method of the representative thickness is not limited to the arithmetic mean. The information on the thickness of the protective component 23 is recorded in the recording part 88c of the grinding apparatus 50 through the transmitting part 38 and the receiving part 90. By executing the thickness measurement step S50, information on the thickness of the protective component 23 after the wafer-with-protective-component forming step S30 and before a grinding step S60 can be acquired. Such information on the thickness of the protective component 23 can become useful in the case of tracking all steps in a manufacturing process of device chips and analyzing a cause of occurrence of a defect and so forth.

After the thickness measurement step S50, the wafer 11 with the protective component 23 is conveyed to the grinding apparatus 50 by using a wafer conveying unit (not illustrated). The wafer 11 with the protective component 23 is held under suction by the holding surface 52a of the chuck table 52 in such a manner that the back surface 11b is oriented upward. In this state, while the total thickness of the wafer 11 with the protective component 23 is measured by the thickness measuring instrument 86, grinding feed of the grinding unit 68 is executed toward the holding surface 52a by the grinding feed unit 54, and the side of the back surface 11b is ground until the thickness of the wafer 11 becomes the intended finished thickness (grinding step S60).

In particular, in the grinding step S60, the control part 88 subtracts the representative thickness of the protective component 23 measured in the thickness measurement step S50 from the total thickness of the wafer 11 with the protective component 23 to calculate the thickness of the wafer 11 in real time. In addition, the control part 88 adjusts an amount of grinding feed to achieve the intended finished thickness. In the present embodiment, even when the thickness of the protective component 23 changes compared with before the wafer-with-protective-component forming step S30, the amount of grinding feed can be adjusted according to the thickness of the protective component 23 after the change in the grinding step S60 because the grinding is executed after the thickness of the protective component 23 after the change is measured. Therefore, an influence of the change in the thickness of the protective component 23 on grinding (processing) conditions can be reduced. Incidentally, in the wafer-protective component close-contact step S20 of the first embodiment, the protective component 23 is disposed on the wafer 11. However, the wafer 11 may be disposed on the protective component 23. Furthermore, a heat generator (not illustrated) may be disposed also in the chuck table 22, and the wafer 11 may be pressed downward in a state in which at least one of the wafer 11 and the protective component 23 is heated in the wafer-with-protective-component forming step S30.

Figure 11:
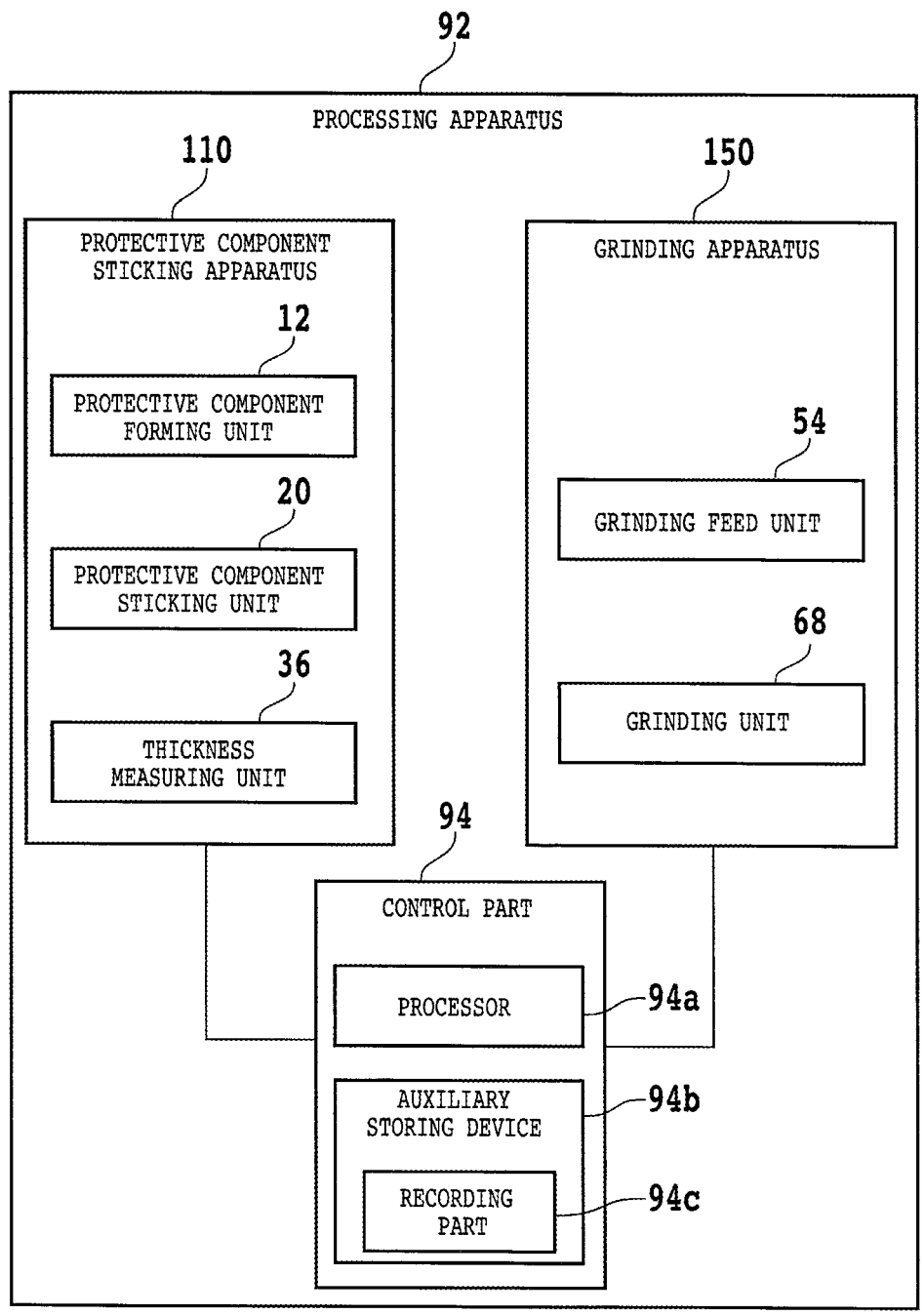
FIG. 11 is a block diagram illustrating an outline of a processing apparatus.

Next, a second embodiment will be described. In the second embodiment, the above-described steps S10 to S60 are executed by using a processing apparatus 92 including a protective component sticking apparatus 110 and a grinding apparatus 150. FIG. 11 is a block diagram illustrating an outline of the processing apparatus 92. The protective component sticking apparatus 110 corresponds to the protective component sticking apparatus 10 from which the transmitting part 38 and the control part 40 are excluded. The grinding apparatus 150 corresponds to the grinding apparatus 50 from which the receiving part 90 and the control part 88 are excluded. The processing apparatus 92 has a control part 94 having functions of both the control part 40 of the protective component sticking apparatus 10 and the control part 88 of the grinding apparatus 50.

For example, the control part 94 is configured by a computer including a processor (processing device) 94a typified by a CPU, a main storing device (not illustrated) such as a DRAM, an SRAM, and a ROM, and an auxiliary storing device 94b such as a flash memory, a hard disk drive, and a solid state drive. The auxiliary storing device 94b includes a recording part 94c. The recording part 94c corresponds to the recording part 88c in the first embodiment. The control part 94 records the thickness (for example, the representative thickness) of the protective component 23 measured by the thickness measuring unit 36 in the recording part 94c. Furthermore, the control part 94 subtracts the representative thickness of the protective component 23 from the total thickness of the wafer 11 with the protective component 23 to calculate the thickness of the wafer 11 in real time. In addition, the control part 94 adjusts the amount of grinding feed in such a manner that the thickness of the wafer 11 becomes the intended finished thickness. Therefore, similarly to the first embodiment, the influence of the change in the thickness of the protective component 23 on grinding (processing) conditions can be reduced.

Next, a third embodiment will be described. In the first and second embodiments, the sheet-shaped protective component 23 that is formed of a thermoplastic resin and does not have a glue layer is created in the protective component sticking apparatus 10, by using the protective component forming unit 12. However, the protective component sticking apparatus 10 does not necessarily need to include the protective component forming unit 12. In this case, a sheet-shaped protective component (not illustrated) having a base layer formed of a thermoplastic resin and a glue layer disposed in a substantially circular region corresponding to the front surface 11a on the base layer or a glue layer disposed at a peripheral part on the base layer is used.

In processing of the wafer 11 in the third embodiment, the protective component forming step S10 is omitted. In the protective component close-contact step S20, an edge part of the protective component 23 is disposed on the annular plate 20b in such a manner that the glue layer faces the front surface 11a. Subsequently, the glue layer is brought into close contact with the side of the front surface 11a by using an air pressure difference. The steps S30 to S60 are executed similarly to the first embodiment. However, in the wafer-with-protective-component forming step S30, a circular columnar roller internally having a heat generator of a resistance heating system is used instead of the pressing body 32. For example, the roller is set to a predetermined temperature of at least 50° C. and at most 120° C., and the roller is rolled and moved across the whole of the side of the front surface 11a for approximately five seconds in a state in which a side surface of the roller is pushed against the protective component 23.

After the roller is evacuated, the wafer 11 with the protective component 23 is cooled. The thickness of the protective component 23 after the cooling decreases by at least 5% and at most 20% (for example, approximately 10%) compared with before the wafer-with-protective-component forming step S30 in some cases. However, also in the third embodiment, the thickness measurement step S50 is executed to measure the thickness of the protective component 23 in the wafer 11 with the protective component 23. Then, in the subsequent grinding step S60, the control part 88 of the grinding apparatus 50 subtracts the representative thickness of the protective component 23 from the total thickness of the wafer 11 with the protective component 23 to calculate the thickness of the wafer 11 in real time. In addition, the control part 88 adjusts the amount of grinding feed to achieve the intended finished thickness. Therefore, similarly to the first embodiment, the influence of the change in the thickness of the protective component 23 due to the wafer-with-protective-component forming step S30 on grinding (processing) conditions can be reduced.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A protective component sticking apparatus that sticks a protective component to a front surface side of a wafer including devices on the front surface side, the protective component sticking apparatus comprising:
  a protective component forming unit configured for forming the protective component sheet separate from the wafer, wherein the protective component forming unit forms the protective component sheet with a sheet of a single-wafer system by pressing a thermoplastic resin pellet while heating the thermoplastic resin;
  a protective component sticking unit that has a support table and a pressing body and attaches the protective component sheet to the wafer through sticking the protective component sheet formed of a resin that softens by heat to the front surface side of the wafer by pressing the protective component sheet against the front surface side of the wafer while heating the protective component sheet with use of the pressing body and the support table;
  a thickness measuring unit that has a thickness measuring instrument and measures a thickness of the protective component sheet in the wafer with the protective component sheet; and
  a transmitting part for transmitting information on the thickness of the protective component sheet measured by the thickness measuring unit to an external of the protective component sticking apparatus.

2. A processing apparatus comprising:
  a protective component forming unit configured for forming a protective component sheet separate from a wafer, wherein the protective component forming unit forms the protective component sheet with a sheet of a single-wafer system by pressing a thermoplastic resin pellet while heating the thermoplastic resin;
  a protective component sticking apparatus that sticks the protective component sheet to a front surface side of the wafer including devices on the front surface side; and
  a grinding apparatus that grinds the wafer for which the protective component sheet has been stuck to the front surface side,
  wherein the protective component sticking apparatus includes a protective component sticking unit that has a support table and a pressing body and forms the wafer with the protective component sheet through sticking the protective component sheet formed of a resin that softens by heat to the front surface side of the wafer by pressing the protective component sheet against the front surface side of the wafer while heating the protective component sheet with use of the pressing body and the support table,
  a thickness measuring unit that has a thickness measuring instrument and measures a thickness of the protective component sheet in the wafer with the protective component sheet, and
  a transmitting part for transmitting information on the thickness of the protective component sheet measured by the thickness measuring unit to the grinding apparatus,
  the grinding apparatus includes
    a chuck table that holds the wafer with the protective component sheet,
    a grinding unit that has a circular columnar spindle and a circular annular grinding wheel mounted on a lower end part of the spindle and grinds a back surface side of the wafer with the front surface side held by the chuck table, and
    a grinding feed unit that executes grinding feed of the grinding unit toward the chuck table,
  the processing apparatus further includes a control part that has a processor and controls operation of the grinding feed unit,
  the control part has a recording part in which the information on the thickness of the protective component sheet measured by the thickness measuring unit, information on a total thickness of the wafer with the protective component sheet, and information on an intended finished thickness of the wafer after grinding are recorded, and
  the control part calculates a thickness of the wafer by subtracting the thickness of the protective component sheet from the total thickness of the wafer with the protective component sheet, and the control part controls the operation of the grinding feed unit to grind the back surface side of the wafer and grind the wafer until the thickness of the wafer reaches the intended finished thickness.

\* \* \* \* \*